(12) United States Patent
Beer

(10) Patent No.: US 6,784,683 B2
(45) Date of Patent: Aug. 31, 2004

(54) CIRCUIT CONFIGURATION FOR SELECTIVELY TRANSMITTING INFORMATION ITEMS FROM A MEASURING DEVICE TO CHIPS ON A WAFER DURING CHIP FABRICATION

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/131,374

(22) Filed: Apr. 24, 2002

(65) Prior Publication Data

US 2002/0153918 A1 Oct. 24, 2002

(30) Foreign Application Priority Data

Apr. 24, 2001 (DE) .......................................... 101 19 869

(51) Int. Cl.[7] .......................... G01R 31/02; G01R 31/26
(52) U.S. Cl. ....................................... 324/765; 324/759
(58) Field of Search ................................ 324/754–755, 324/759, 765, 763; 714/718, 742; 365/201

(56) References Cited

U.S. PATENT DOCUMENTS 5,506,499 A * 4/1996 Puar ........................ 324/158.1
6,064,213 A 5/2000 Khandros et al. ........... 324/754
6,380,755 B1 * 4/2002 Sato ........................... 324/765

FOREIGN PATENT DOCUMENTS

DE 42 13 905 A1 11/1993

* cited by examiner

Primary Examiner—Kamand Cuneo
Assistant Examiner—Paresh Patel
(74) Attorney, Agent, or Firm—Laurence A. Greenberg; Werner H. Stemer; Gregory L. Mayback

(57) ABSTRACT

The circuit configuration allows selective transmission of information items to a chip of a wafer during chip fabrication, and an apparatus having a needle card. During the test procedure of chips of a wafer which are tested in parallel, the problem can arise that, by way of example, an individual chip has a repairable defect or an incorrectly set voltage. Since a plurality of chips, for example memory modules, are tested simultaneously by a measuring device, it is not readily possible to transmit targeted information items to the individual chip. An external memory is thus assigned to each contact array on a needle card. In that memory, the individual information items are buffer-stored and transmitted to the individual chip. This affords the advantage that specific defective chips can be repaired in a simple manner without additional, costly control devices being necessary.

14 Claims, 2 Drawing Sheets

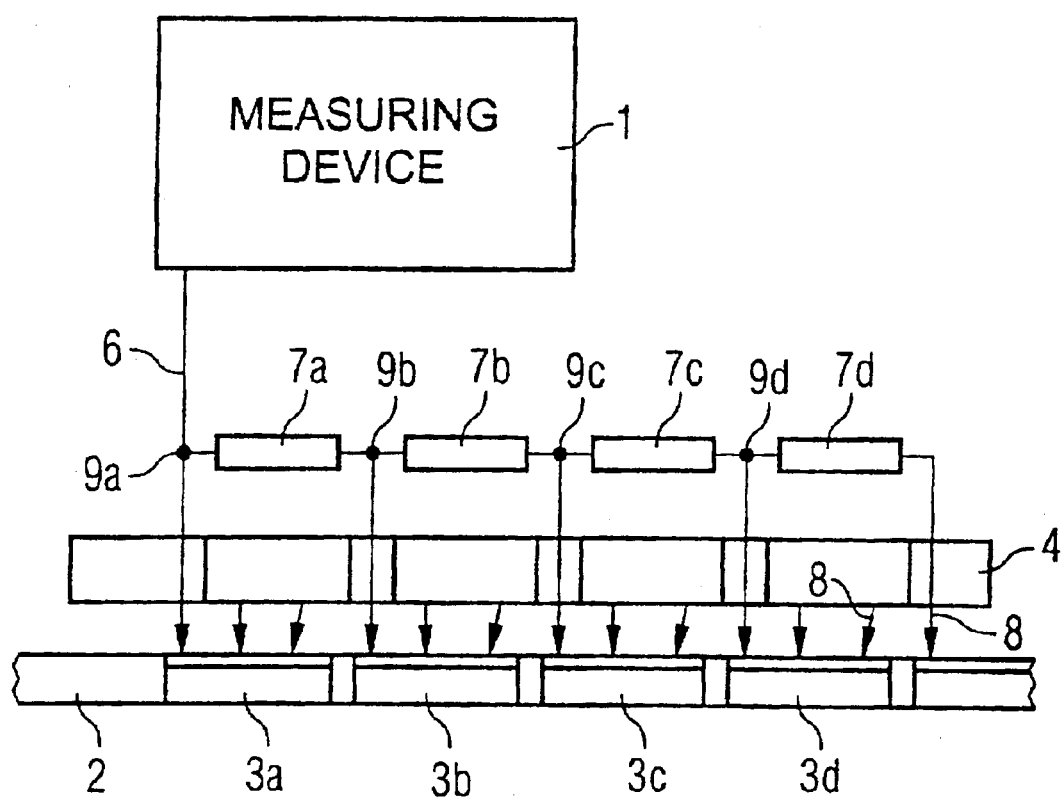

CIRCUIT CONFIGURATION FOR SELECTIVELY TRANSMITTING INFORMATION ITEMS FROM A MEASURING DEVICE TO CHIPS ON A WAFER DURING CHIP FABRICATION

BACKGROUND OF THE INVENTION

Field of the Invention

The invention pertains to a circuit configuration for selectively transmitting information items from a measuring device to chips on a wafer, to a wafer having a plurality of chips for use with such a circuit configuration, and to a system having such a circuit configuration and such a wafer.

It has been known heretofore that a plurality of identical chips which have been fabricated as memory components, for example, are contact-connected simultaneously by a corresponding measuring device and measured with the predetermined identical parameters. This method can reduce the relatively high testing costs in particular for functional tests on the wafer, since the test capacity and thus the throughput can be considerably increased by virtue of the parallel testing. However, if a partly defective chip is identified during the testing procedure, then there is the problem of identifying in a targeted manner the defective component from the plurality of chips which are tested in parallel.

In the case of memory components having a high storage capacity, in particular, a few individual memory cells, for example, may be defective. The defective cells can be disabled or repaired by repair files that are to be input. The chip does not incur any quality losses as a result of this since the repaired cells can no longer be identified afterward. Moreover, in the case of DRAM memories (Dynamic Random Access Memories) it can happen that one chip requires a different voltage trimming in order to achieve its full functionality. These problems can likewise be eliminated by corresponding trimming files if there is access to the individual chip via data and command lines.

In state of the art test systems, although the required files can be transmitted to an individual chip, this nonetheless requires a separate control unit in addition to the measuring device, which control unit manages the individual driver channels for all the contact-connected chips and controls them correspondingly according to a defect that is present. Moreover, this additional control unit can be utilized exclusively for individual data transmission. A control unit of this type is relatively complicated and leads to undesired costs as a result of the additional programs that are required.

U.S. Pat. No. 6,064,213 discloses a circuit configuration for selectively transmitting information items from a measuring device to chips on a wafer, generically referred to as a wafer-level burn-in test device. There, a plurality of chips can be simultaneously contact-connected via assigned contact arrays of a needle card and can be measured in parallel by the measuring device. A plurality of memories are each assigned to a contact array on the needle card. The measuring device is configured to transmit information items for a selected chip individually via the assigned memory to the chip. That is, in the configuration, each contact array of a needle card is assigned an external module with a storage functionality, a measuring device being designed for transmitting information items to a selected chip on a wafer individually via the assigned external module. German published patent application DE 42 13 905 A1 discloses using a shift register for converting a serial data stream in an external module with storage functionality.

SUMMARY OF THE INVENTION

It is accordingly an object of the invention to provide a simple and cost-effective circuit configuration for selectively transmitting information items from a measuring device to chips on a wafer, which overcomes the above-mentioned disadvantages of the heretofore-known devices and methods of this general type and wherein the measuring device enables a plurality of chips to be tested simultaneously. It is a further object to provide a wafer having a plurality of chips for use with such a circuit configuration, and a system having such a circuit configuration and such a wafer.

With the foregoing and other objects in view there is provided, in accordance with the invention, a circuit configuration for selectively transmitting information items from a measuring device to chips on a wafer, comprising:

a needle card having a plurality of contact arrays configured to simultaneously contact a plurality of chips on the wafer;

a measuring device connected to the needle card and configured to measure the plurality of chips on the wafer in parallel via the contact arrays;

a plurality of memories each assigned to a respective the contact array on the needle card, the measuring device being connected to transmit information items for a selected chip individually via a respective the assigned memory to the chip; and each of the memories having an input and an output, and the plurality of memories being connected up sequentially, with the output of a respective the memory connected to the input of a succeeding the memory.

There is also provided, in accordance with the invention, a wafer for use with the above circuit configuration. The wafer has a plurality of chips (i.e., integrated circuits) each having an internal memory.

With the above and other objects in view there is also provided, in accordance with the invention, a wafer-level testing system, comprising a circuit configuration and a wafer as outlined above. That is:

a wafer with a plurality of chips each having an internal memory;

a needle card having a plurality of contact arrays configured to simultaneously contact a plurality of the chips on the wafer;

a measuring device connected to the needle card and configured to measure the chips on the wafer in parallel via the contact arrays;

a plurality of memories each assigned to a respective the contact array on the needle card, and each of the memories having an input and an output, and the plurality of memories being connected up sequentially, with the output of a respective the memory connected to the input of an adjacent the memory, and with the output of a respective the memory connected to an input of a respective the internal memory of the succeeding chip.

In other words, in the case of the novel configuration of the memory arrangement, a plurality of memories are connected up sequentially, so that the output of a memory is connected to the input of a succeeding memory. As a result, the information present at the output is transmitted onto the succeeding memory with the next clock signal.

In the case of the novel configuration of the wafer, each chip has an internal memory to which the information items can be transmitted in parallel from the memories of the circuit configuration. In the case of memory chips, this function can advantageously be performed by the memory cells present.

The novel circuit configuration for selectively transmitting information items to one of a plurality of chips of a wafer which are measured in parallel, the novel wafer for use with such a circuit configuration, and the novel system having such a circuit configuration and such a wafer have the advantage that an additional control unit can be dispensed with. Each chip which is contact-connected in parallel can nevertheless be addressed individually by the measuring device and any desired information items such as files and commands can be transmitted to the selected chip. As a result, not only are costs for an additional controller obviated, but also the programming is considerably simplified in an advantageous manner.

It is further regarded as particularly advantageous that the external memories are configured as shift registers. Shift registers are simple circuits wherein an information item applied to the input can be advanced with each clock cycle. The number of clock cycles thus determines, in a simple manner, the chip to which the information items are to be transmitted. In this way, it is advantageously possible to select an individual chip for the transmission of information items.

It is also favorable for the internal memories of the chips to be designed as shift registers. The information intended for an individual chip is stored thereby.

Since the outputs of the internal memories of the chips are open and the output of an external memory is connected to the input of the succeeding chip and thus the input of the succeeding internal memory, the information present always passes in a simple manner directly to an individual chip. An individual chip can be individually addressed in this way.

Since the measuring device knows the present data of the chips which are tested in parallel, it can also advantageously generate the information items which are to be transmitted to an individual chip.

In order that the information items, which are sent as a data string from the measuring device, can be transmitted to the desired chip, the input of the first external memory and the input of the first chip or the internal memory thereof are connected in parallel and connected to the measuring device.

By virtue of the sequential transmission of the information items to all the external memories, each chip advantageously receives the individual information intended for it.

The sequential transmission of the information items to all the external and internal memories furthermore has the effect that the information items input first pass to the internal memory of the last contact-connected chip.

On the other hand, it is also advantageous that the information items input last are transmitted to the internal memory of the first chip. As a result, the information items can be controlled in a targeted manner.

A further advantage also exists if the circuit configuration is employed for chips which are designed as memory modules such as DRAMs. These modules are clocked dynamically and can easily store the information items received. An additional memory is then no longer necessary.

A particularly favorable solution is produced if the information items contain data which can be used, for example, to repair an individual chip. In that case, the chip is not lost, so that the yield can easily be increased by means of the repair method.

It is also favorable to carry out the transmission of information items to an individual chip which contain data for voltage trimming. Since certain process tolerances always have to be expected on account of the fabrication process, a simple correction of the voltage can advantageously be carried out even after the completion of the chips.

Other features which are considered as characteristic for the invention are set forth in the appended claims.

Although the invention is illustrated and described herein as embodied in a circuit configuration for selectively transmitting information items from a measuring device to chips on a wafer during chip fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a sectional diagram of the measuring device.

DESCRIPTION OF THE PREFERRED EMBODIMENTS

Figure 1:
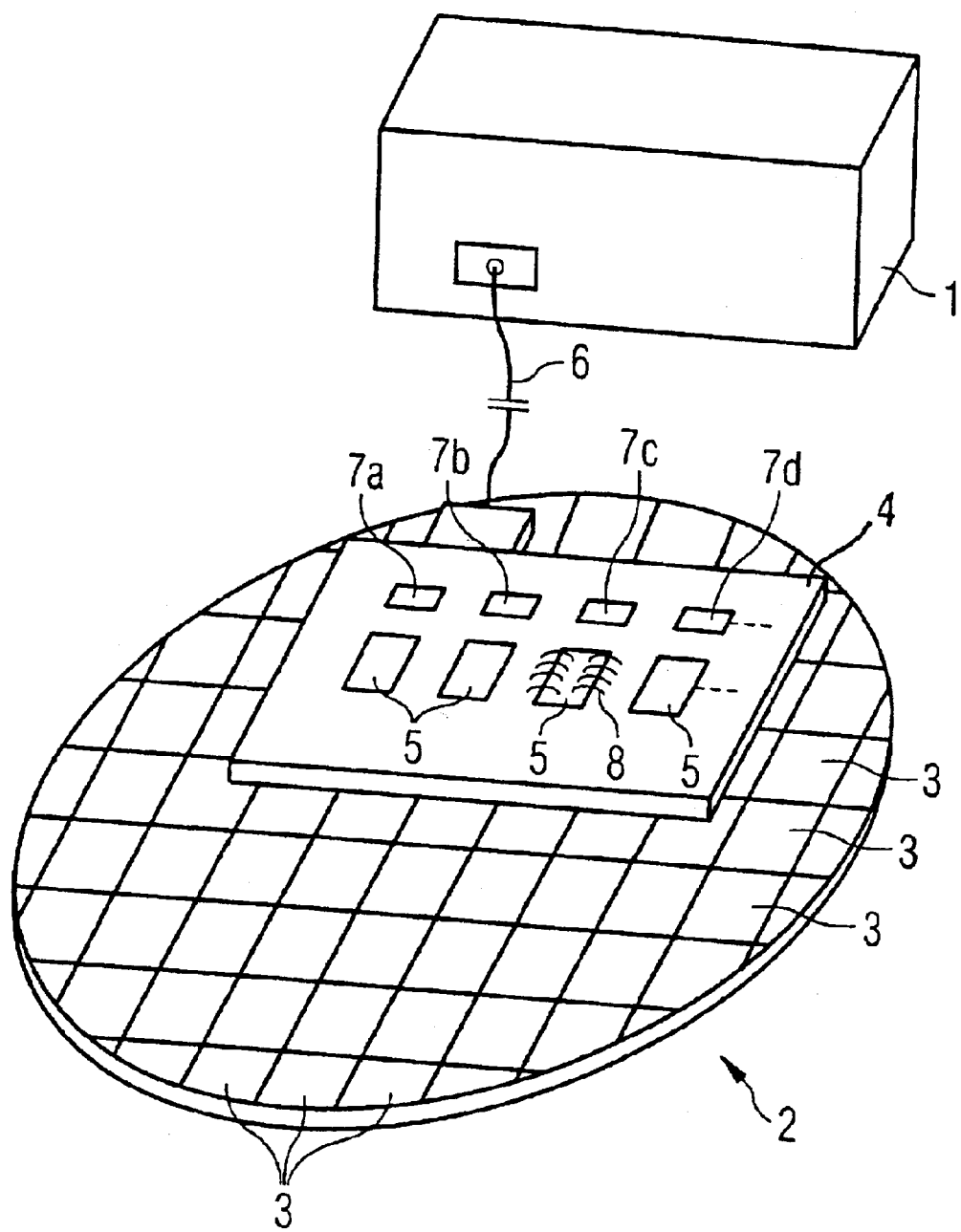
FIG. 1 is a diagrammatic perspective view of a system according to the invention showing a waver and a measuring device.

Referring now to the figures of the drawing in detail and first, particularly, to FIG. 1 thereof, there is shown a measuring device 1, which is connected to a needle card 4 via multi-core measurement and control lines 6. The apparatus is part of a complex measurement system that is configured, by way of example, for testing a wafer 2. In the semiconductor industry, in particular, it is customary for the chips 3 which are integrated on the wafer 2 and are arranged in a matrix of rows and columns to be checked with regard to their electrical data, properties, and functionality prior to dicing and further processing. In this state, adjustment and trimming functions can also be carried out. The chips 3 (here prior to dicing, and therefore also referred to as individual integrated circuits) are formed with corresponding contact lands onto which a multiplicity of measuring probes 8 of the needle card 4 are placed. During the test procedure, the electrical contact between the actual chip 3 and the measuring device 1 is established via the measuring probes 8, to which the lines 6 are connected. Owing to the multiplicity of measuring probes 8 and the relatively small contact lands available, the measuring probes 8 are combined in contact fields or contact arrays 5. In order to configure the test operation such that it is more effective and faster, in the case of specific chips 3 it is also possible for a plurality of adjacent chips 3 to be tested simultaneously. By way of example, in the case of chips 3 which are designed as memory chips, a plurality of chips 3 can be tested in parallel since the function of these chips is identical and, for example, the memory function can easily be checked. Suitable memory chips 3 are, for example, DRAMs (Dynamic Random Access Memories) or similar components.

For the test, the wafer 2 is fixed onto a table of a special wafer prober, for example by vacuum, and displaced stepwise relative to the needle card 4 by the sampler. For this purpose, the table is equipped with an automatically controllable drive which can move it in the x, y and z directions.

As a result, the wafer 2 can be scanned through systematically from chip to chip by way of a corresponding control program. For reasons of clarity, however, the wafer prober has not been illustrated in FIG. 1.

The needle card 4 contains, for example, four contact arrays 5 with the corresponding measuring probes 8. The measuring probes 8 have only been indicated diagrammatically. Their number and orientation depend on the makeup and conditions on the chip 3 and the control and test program. In the case of parallel multiple measurement, four needle arrays 5, for example, are connected in parallel and the relevant chips 3 are measured in parallel. Of course, the number of contact arrays connected in parallel is freely selectable and not limited by the invention. The connecting lines on the needle card 4 between the measuring probes 8 and the measurement and control line 6 have also not been illustrated.

Furthermore, according to the invention, specific measuring probes 8 of a needle array 5 are connected to an external memory 7a–d, the external memories 7a–d preferably being interconnected as shift registers. The precise function and connections will be explained in more detail in connection with FIG. 2. The external memories 7a–d are preferably arranged on the needle card 4 as far as possible in the vicinity of the contact arrays 5, in order to obtain the shortest possible line paths for reasons of interference immunity.

An alternative configuration of the invention provides for the external memories 7a–d to be arranged in the or in the vicinity of the measuring device 1 or on the wafer prober.

The method of operation of this configuration is explained in more detail with reference to the diagrammatic illustration in FIG. 2. FIG. 2 firstly shows the measuring device 1, which is connected to the needle card 4 via the measurement and control lines 6. Furthermore, the measuring device 1 is connected to a first chip 3a via a node 9a, depending on the application via one or more measuring probes 8. Internal memories 3a–d are provided on each chip in a similar manner to the external memories 7a–d on the needle card 4. These internal memories 3a–d act in a similar manner to shift registers. In the case of memory chips 3 to be measured, the internal memories 3a–d may be part of the memories that are present. The internal memories 3a–d are open at their output, however, so that only the information present last at their input is stored.

A respective output of the external memories 7a–d is connected via an assigned node 9b–d in each case to an input of a succeeding external memory 7a–d. Furthermore, the output of an external memory 7a–d is connected to the input of the internal memory of the succeeding chip 3. By way of example, at the node 9b, the output of the external memory 7a is connected to the input of the memory 3b, the node 9c is connected to the internal memory 3c, etc. The first node 9a is connected to the input of the first memory 7a.

The method of operation of this configuration will now be explained in more detail below. In order to address an individual chip 3 in a targeted manner, for example the internal memory 3d of the chip 3, the measuring device 1 sends the information in the form of a data string firstly to the node 9a. As a result, the information items pass both into the external memory 7a and into the internal memory 3a. With each further clock pulse, the information is transmitted through the shift register 7a–d and, in parallel therewith, into the internal memories 3a–d. The information depth per shift register is freely selectable in this case. If it is 4 bits per chip, for example, clocking has to be effected 12 (=4×3) times before the information is distributed. In our example, then, the information has arrived both at the external memory 7d and at the internal memory 3d after three clock cycles. The information items transferred first thus travel right into the last chip, while the information items input last are only stored in the first chip.

In this way, it is possible, without having to take special addressing measures, to transmit an information item to an individual chip 3. Since the transmitted information items are not restricted in terms of type, they can contain data, control commands, addresses, etc. for the individual control of the selected chip 3. As a result, individual repairs and settings can advantageously be carried out.

I claim:

1. A circuit configuration for selectively transmitting information items from a measuring device to chips on a wafer, comprising:

a needle card having a plurality of contact arrays configured to simultaneously contact a plurality of chips on the wafer;

a measuring device connected to said needle card and configured to measure the plurality of chips on the wafer in parallel via said contact arrays;

a plurality of memories each assigned to a respective said contact array on said needle card, said measuring device being connected to transmit information items for a selected chip individually via a respective said assigned memory to the chip; and each of said memories having an input and an output, and said plurality of memories being connected up sequentially, with said output of a respective said memory connected to said input of a succeeding said memory.

2. The circuit configuration according to claim 1, wherein each of said memories has a shift register.

3. The circuit configuration according to claim 1, wherein said plurality of memories are disposed on said needle card.

4. The circuit configuration according to claim 1, wherein said measuring device is configured to generate the information for a selected chip.

5. In combination with a circuit configuration according to claim 1, a wafer having a plurality of chips each having an internal memory.

6. The combination according to claim 5, wherein said internal memory of each of said chips has a shift register.

7. The combination according to claim 5, wherein said internal memory of each of said chips remains open at its output.

8. The system according to claim 1, wherein said measuring device is configured to transmit information items containing data for voltage trimming of an individual chip.

9. A wafer-level testing system, comprising:

a wafer with a plurality of chips each having an internal memory;

a needle card having a plurality of contact arrays configured to simultaneously contact a plurality of said chips on said wafer;

a measuring device connected to said needle card and configured to measure said chips on said wafer in parallel via said contact arrays;

a plurality of memories each assigned to a respective said contact array on said needle card, said measuring device being connected to transmit information items for a selected chip individually via a respective said assigned memory to the chip, and each of said memories having an input and an output, and said plurality of memories being connected up sequentially, with said output of a respective said memory connected to said input of an adjacent said memory, and with said output of a respective said memory connected to an input of a respective said internal memory of the succeeding chip.

10. The system according to claim 9, wherein said measuring device is configured to transmit information items in parallel into a respective first memory a respective first said internal memory of said chips.

11. The system according to claim 9, wherein said measuring device is configured to transmit information items sequentially to said internal memories of said chips, so that each said chip receives individual information.

12. The system according to claim 11, wherein the information input first is transmitted on to said internal memory of a last contact-connected chip.

13. The system according to claim 11, wherein the information input last is transmitted into said internal memory of a first contact-connected chip.

14. The system according to claim 9, wherein said measuring device is configured to transmit information items containing data for repairing an individual chip.

* * * * *